US010840352B2

(12) United States Patent
Rachmady et al.

(10) Patent No.: US 10,840,352 B2
(45) Date of Patent: Nov. 17, 2020

(54) NANOWIRE TRANSISTORS WITH EMBEDDED DIELECTRIC SPACERS

(71) Applicant: Intel Corporation, Santa Clara, CA (US)

(72) Inventors: Willy Rachmady, Beaverton, OR (US); Seung Hoon Sung, Portland, OR (US); Jack T. Kavalieros, Portland, OR (US); Sanaz K. Gardner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 15/780,619

(22) PCT Filed: Dec. 22, 2015

(86) PCT No.: PCT/US2015/067537
§ 371 (c)(1),
(2) Date: May 31, 2018

(87) PCT Pub. No.: WO2017/111974
PCT Pub. Date: Jun. 29, 2017

(65) Prior Publication Data
US 2020/0168703 A1    May 28, 2020

(51) Int. Cl.
*H01L 29/66* (2006.01)
*B82Y 10/00* (2011.01)
(Continued)

(52) U.S. Cl.
CPC ........ *H01L 29/66439* (2013.01); *B82Y 10/00* (2013.01); *B82Y 40/00* (2013.01);
(Continued)

(58) Field of Classification Search
CPC combination set(s) only.
See application file for complete search history.

(56) References Cited

U.S. PATENT DOCUMENTS

| 6,713,357 | B1 * | 3/2004 | Wang | ................ H01L 21/76834 |
| | | | | 257/E21.576 |
| 8,778,768 | B1 * | 7/2014 | Chang | ............... H01L 29/42392 |
| | | | | 257/213 |

(Continued)

OTHER PUBLICATIONS

Chandler, Explained: Nanowires and nanotubes Tiny filaments and cylinders are studied for possible uses in energy, electronics, optics and other fields, MIT News, 3 pages (Year: 2013).*

(Continued)

*Primary Examiner* — Earl N Taylor
(74) *Attorney, Agent, or Firm* — Green, Howard & Mughal LLP

(57) ABSTRACT

Nanowire transistors including embedded dielectric spacers to separate a gate electrode from source and drain regions of the transistor. Embedded spacers are disposed within interior sidewalls of a passage through which the gate electrode wraps around a semiconductor filament. The presence of these embedded spacers may dramatically reduce fringe capacitance, particularly as the number of wires/ribbons/filaments in the transistor increases and the number of interior gate electrode passages increases. In some advantageous embodiments, embedded dielectric spacers are fabricated by encapsulating external surfaces prior to those surfaces becoming embedded within the transistor.

17 Claims, 11 Drawing Sheets

(51) Int. Cl.
- *B82Y 40/00* (2011.01)
- *H01L 29/06* (2006.01)
- *H01L 29/08* (2006.01)
- *H01L 29/20* (2006.01)
- *H01L 29/201* (2006.01)
- *H01L 29/78* (2006.01)

(52) U.S. Cl.
CPC ...... *H01L 29/0673* (2013.01); *H01L 29/0847* (2013.01); *H01L 29/201* (2013.01); *H01L 29/2006* (2013.01); *H01L 29/78* (2013.01)

(56) References Cited

U.S. PATENT DOCUMENTS

| | | | | |
|---|---|---|---|---|
| 9,177,966 | B1* | 11/2015 | Rabkin | H01L 27/11582 |
| 2011/0175169 | A1* | 7/2011 | Cheng | H01L 21/823412 |
| | | | | 257/369 |
| 2014/0001441 | A1* | 1/2014 | Kim | H01L 21/30604 |
| | | | | 257/29 |
| 2014/0225065 | A1* | 8/2014 | Rachmady | H01L 29/775 |
| | | | | 257/24 |
| 2014/0339611 | A1* | 11/2014 | Leobandung | H01L 29/78609 |
| | | | | 257/288 |
| 2015/0340457 | A1* | 11/2015 | Xie | H01L 29/66545 |
| | | | | 257/288 |
| 2018/0166553 | A1* | 6/2018 | Lee | H01L 29/41766 |
| 2018/0182854 | A1* | 6/2018 | Ozaki | H01L 23/4952 |

OTHER PUBLICATIONS

International Search Report and Written Opinion from PCT/US2015/067537 dated Sep. 21, 2016, 13 pgs.

International Preliminary Report on Patentability from PCT/US2015/067537 dated Jul. 5, 2018, 12 pgs.

Office Action from Taiwanese Patent Application No. 105137681 dated Jun. 12, 2020, 25 pgs.

\* cited by examiner

NANOWIRE TRANSISTORS WITH EMBEDDED DIELECTRIC SPACERS

CLAIM OF PRIORITY

This Application is a National Stage Entry of, and claims priority to, PCT Application No. PCT/US2015/067537, filed on Dec. 22, 2015 and titled "NANOWIRE TRANSISTORS WITH EMBEDDED DIELECTRIC SPACERS", which is incorporated by reference in its entirety for all purposes.

BACKGROUND

Transistors employed in Integrated Circuits (ICs) continue to scale. With finFETs now being the transistor architecture of choice for the most advanced CMOS ICs, next-generation transistor architectures may employ gate-all-around (GAA) architectures (also known as nanowire/nanoribbon transistors) to enable a further reduction in channel length (e.g., for the CMOS 10 nm technology node, and beyond).

In a finFET the gate electrode straps over a semiconductor fin. However, in a nanowire transistor, the gate electrode forms a belt completely around a semiconductor filament or nanowire having a much smaller current carrying cross-section than typical of a finFET. As such, many nanowire architectures unfortunately suffer from high fringe capacitance due to an increase in gate overlap with the source/drain. Increases in such parasitics detrimentally impact transistor performance.

Nanowire transistors having an architecture that will suffer relatively less fringe capacitance, and the techniques to make such transistors, are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
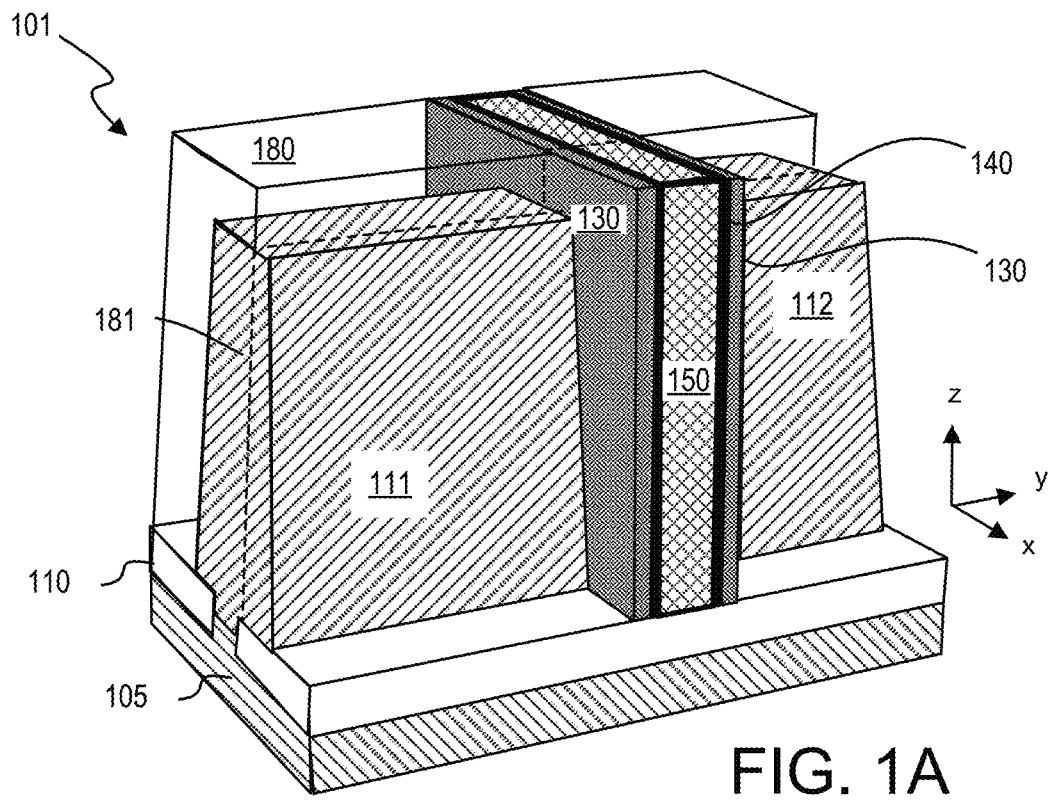
FIG. 1A is an isometric view of a nanowire transistor including embedded dielectric spacers, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present embodiments may be practiced without these specific details. In some instances, well-known methods and devices are shown in block diagram form, rather than in detail, to avoid obscuring the features of the embodiments. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are nanowire transistors including embedded dielectric spacers. The embedded dielectric spacers are to laterally separate a gate electrode from source and drain regions of the transistor. The separation provided by the embedded dielectric spacers reduces parasitic capacitance of a nanowire transistor as a further function of the relative permittivity (or dielectric constant) associated with the material (or void) serving as the embedded dielectric spacer. Dielectric spacers are referred to herein as "embedded" or "internal" because unlike a dielectric spacer disposed along exterior sidewalls of a gate electrode, embedded spacers are disposed within interior sidewalls of a passage through which the gate electrode extends as it wraps around a semiconductor filament. The presence of these embedded spacers may dramatically reduce fringe capacitance, particularly as the number of wires/ribbons/filaments in the transistor increases, and the number of interior gate electrode passages increases. In some advantageous embodiments described further below, embedded dielectric spacers are fabricated by encapsulating external semiconductor surfaces prior to those surfaces becoming embedded below a source and drain of the transistor.

FIG. 1A is an isometric view of external surfaces of a nanowire transistor including embedded dielectric spacers, in accordance with some embodiments. As shown, nanowire transistor 101 is disposed on a substrate including a semiconductor region 105, and an isolation dielectric region 110 that surrounds an exposed surface of semiconductor region 105 upon which transistor 101 is disposed. Nanowire transistor 101 includes a source 111 and a drain 112. Source 111 and drain 112 are separated laterally (e.g., in the y-dimension) from a gate electrode 150 by an external dielectric spacer 130. Gate electrode 150 is disposed over a top surface of transistor channel region(s), and extends a lateral length (e.g., in the x-dimension) over isolation dielectric region 110. In this example, a gate dielectric 140 is also visible from the vantage point provided in FIG. 1A. An interlayer dielectric (ILD) 180 is disposed over source 111 and drain 112 and planarized with a top surface of gate electrode 150. In FIG. 1A, ILD 180 is sectioned along a plane 181 coincident with one sidewall of the nanowire semiconductor channel regions.

Figure 1B:
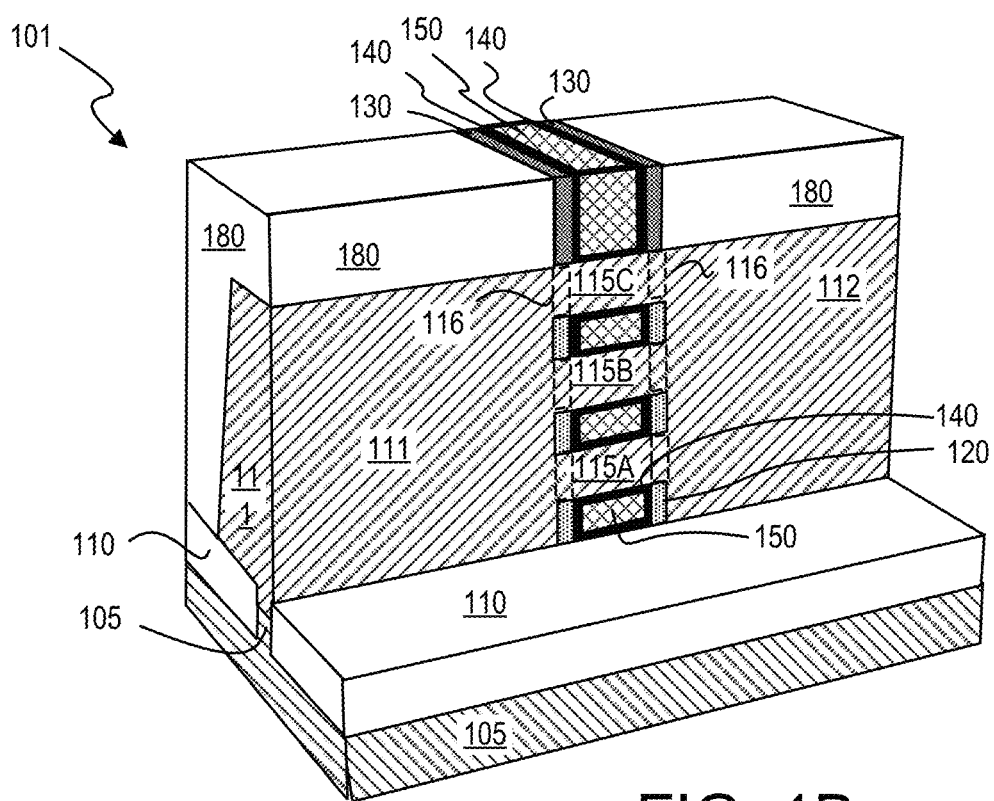
FIG. 1B is an isometric sectional view of the nanowire transistor illustrated in FIG. 1A, in accordance with some embodiments.

FIG. 1B is an isometric sectional view further illustrating internal surfaces of transistor 101 as viewed along the plane 181 denoted in FIG. 1A. In FIG. 1B, semiconductor filament 115A extends a lateral length between a source 111 and drain 112. In the illustrative embodiment, a plurality of semiconductor filaments 115A, 115B, and 115C are aligned in a vertical stack (e.g., in the z-dimension). Filaments 115A-115C are electrically coupled in parallel to source 111 and drain 112. Within the lateral length of each semiconductor filament there is a channel portion disposed between two end portions 116 denoted in dashed line. End portions 116 couple channel portions of filaments 115A-115C to source 111 and drain 112. Disposed between filament 115A and substrate 105 within the channel portion is the gate stack including gate electrode 150 separated from filament 115A by gate dielectric 140. An embedded spacer 120 is disposed between filament 115A and substrate 105 within end portions 116.

As clear from FIG. 1A and FIG. 1B, external spacer 130 contacts two opposite sidewalls of internal spacer 120 just as a portion of gate dielectric material 140 interfaces with two opposite sidewalls of transistor filaments 115A-115C. Gate dielectric material 140 contacts a third sidewall of embedded dielectric spacer 120, and source or drain 111, 112 contacts a fourth sidewall of embedded dielectric spacer 120. In some embodiments, embedded spacer 120 separates gate electrode 140 from source 111 and the drain 112 by a lateral distance (e.g., in the y-dimension) that is substantially equal to the lateral distance (e.g., in the y-dimension) by which external spacer 130 separates the gate electrode 150 from source 111 and drain 112. In some exemplary embodiments, embedded spacer 120 provides a separation of no more than 5 nm (e.g., 1-5 nm).

As shown in FIG. 1B, embedded spacer 120 separates the gate stack from the source/drain. Hence, only gate dielectric 140, which is advantageously of at least one material having a high bulk relative permittivity (e.g., k greater than 9.0) separates gate electrode 150 from surfaces of the channel region of filament 115A Embedded spacer 120, which is advantageously of at least one material having a low bulk relative permittivity (e.g., k less than 8.0) laterally separates gate electrode 150 from source 111 and drain 112. Any dielectric material may be employed as embedded spacer 120. The lower the permittivity of the embedded spacer 120, the greater the reduction in parasitic capacitance between gate electrode 150 and source 111 and/or drain 112. The dielectric material may also be amorphous. Some exemplary embedded spacer dielectrics include fluorosilicate glass, carbon-doped Si (SiC), silicon nitride (SiN), carbon-doped silicon nitride (SiCN), carbon-doped silicon oxide (SiOC), silicon oxide (SiO), silicon-based polymeric dielectrics, such as hydrogensilsesquioxane (HSQ) and methylsilsesquioxane (MSQ), and other porous dielectrics.

Although the material composition of embedded spacer 120 may be the same as external spacer 130, in some advantageous embodiments embedded spacer 120 has a different composition that external spacer 130. For example, external spacer 130 may be an amorphous material having a first composition, and embedded spacer 120 may be an amorphous material having a second composition. In some advantageous embodiments, both spacers 120 and 130 are of materials having a relative permittivity below 8, advantageously below 4, and more advantageously below 3.5. As described further below, differentiating the compositions of spacers 120 and 130 may have some manufacturing advantages. In some such embodiments, embedded spacer 120 has a lower bulk relative permittivity than that of external spacer 130. For example, where external spacer 130 is SiCN or SiC, embedded spacer 120 may be SiOC, HSQ, or MSQ.

As further illustrated in FIG. 1B, where one or more additional semiconductor filaments are disposed over a first filament, the gate stack is further disposed between the various filaments. For example, gate electrode 150 passes between each of filaments 115A, 115B, and 115C with gate dielectric 140 separating gate electrode 150 from each of the filaments. Embedded spacer 120 is further disposed between ends portions of each of filaments 115A-C to laterally separate the gate electrode 150 from the source/drain 111/112 by substantially the same spacing (e.g., in y-dimension).

For some exemplary embodiments, substrate semiconductor region 105 is silicon (Si), which is advantageous for monolithic integration on large format substrate (e.g., 300-450 mm diameters). Crystallographic orientation of a substantially monocrystalline substrate in exemplary embodiments is advantageously (100), but may also be (111), or (110). Other crystallographic orientations are also possible. For example, a substrate working surface may be miscut, or offcut 2-10° toward [110], to facilitate nucleation of heteroepitaxial semiconductor materials. Other substrate embodiments are also possible, with some examples including silicon-carbide (SiC), sapphire, a III-V compound semiconductor (e.g., GaAs), germanium (Ge), or silicon-germanium (SiGe). Furthermore, substrate semiconductor 105 may region comprise a portion of a bulk crystalline substrate or may be comprise an insulated device layer of a semiconductor on insulator (SOI) substrate where the semiconductor may be any of Si, SiGe, Ge, or group III-V.

Notably, architectures in accordance with some embodiments are applicable to a wide variety of semiconductor material systems including both silicon and non-silicon (e.g., other group IV, or group III-V systems). In some embodiments where transistor 101 is a silicon transistor, each semiconductor filament 115A-115C is a silicon crystal. In some other group IV embodiments, each semiconductor filament 115A-115C is a SiGe crystal. In still other group IV embodiments, each semiconductor filament 115A-115C is a Ge crystal. In some other non-silicon embodiments, each semiconductor filament 115A-115C is a group III-V compound semiconductor (e.g., GaAs, InP, InAs, InGaAs, AlGaAs, GaP, AlAs, InGaP).

In some embodiments, transistor 101 is an NMOS device with source 111 and drain 112 each being a semiconductor impurity doped to a high level (e.g., $1e^{18}$ atoms/cm$^3$, or more) with an electrically active donor species (i.e., n+ doped). For example, a III-V semiconductor filament may be coupled to n+ doped III-V semiconductor source/drain 111/112. In some alternative embodiments, transistor 101 is a PMOS device with source 111 and drain 112 each being a semiconductor impurity doped to a high level with an electrically active acceptor species (i.e., p+ doped). Source 111 and drain 112 may, but need not, have the same composition as that of filaments 115A-115C. For example, a Ge semiconductor filament may be coupled to a p+ doped Ge semiconductor source/drain 111/112. A III-V semiconductor filament of a first alloy may be coupled to a n+ doped III-V semiconductor source/drain 111/112 also of the first alloy, or of a second alloy. Source 111 and/or drain 112 may each comprise heavily doped portions of individual semiconductor filaments separated by heavily doped intervening material layers, or may be a single crystal of substantially uniform composition as illustrated in FIG. 1B. In the illustrative embodiment, source 111 and drain 112 are single crystals interfacing with end portions 116 of each filament 115A-115C. In some exemplary embodiments where filaments 115A-115C are Ge, source 111 and drain 112 are single crystals of p+ doped Ge. In other embodiments where filaments 115A-115C are a III-V semiconductor, source 111 and drain 112 are single crystals of n+ doped III-V semiconductor.

In still other embodiments, transistor 101 is may be a tunnel field effect transistor (TFET) with source 111 and drain 112 each being a semiconductor impurity doped to a high level with an electrically active species of opposite conductivity type (i.e., to form a gated p-i-n structure).

Architectures in accordance with some embodiments are applicable to a wide variety of gate stacks as the choice of gate stack materials is a function of the semiconductor materials systems employed for filaments 115A, 115C, the type of transistor (e.g., TFET, MOSFET), conductivity (n-type/p-type) and operational mode (e.g., depletion/enhancement). In some exemplary nanowire FET embodiments where semiconductor filaments 115A-115C comprises a crystal of Si, SiGe, Ge or a III-V compound, gate dielectric material is selected from the group consisting of $HfO_2$, $Al_2O_3$, $HfSiO_x$, $HfAlO_x$, and $TaSiO_x$. In some further embodiments, gate electrode 150 includes a metal or metal alloy with a work function suitable for the chosen semiconductor filament(s).

Figure 2:
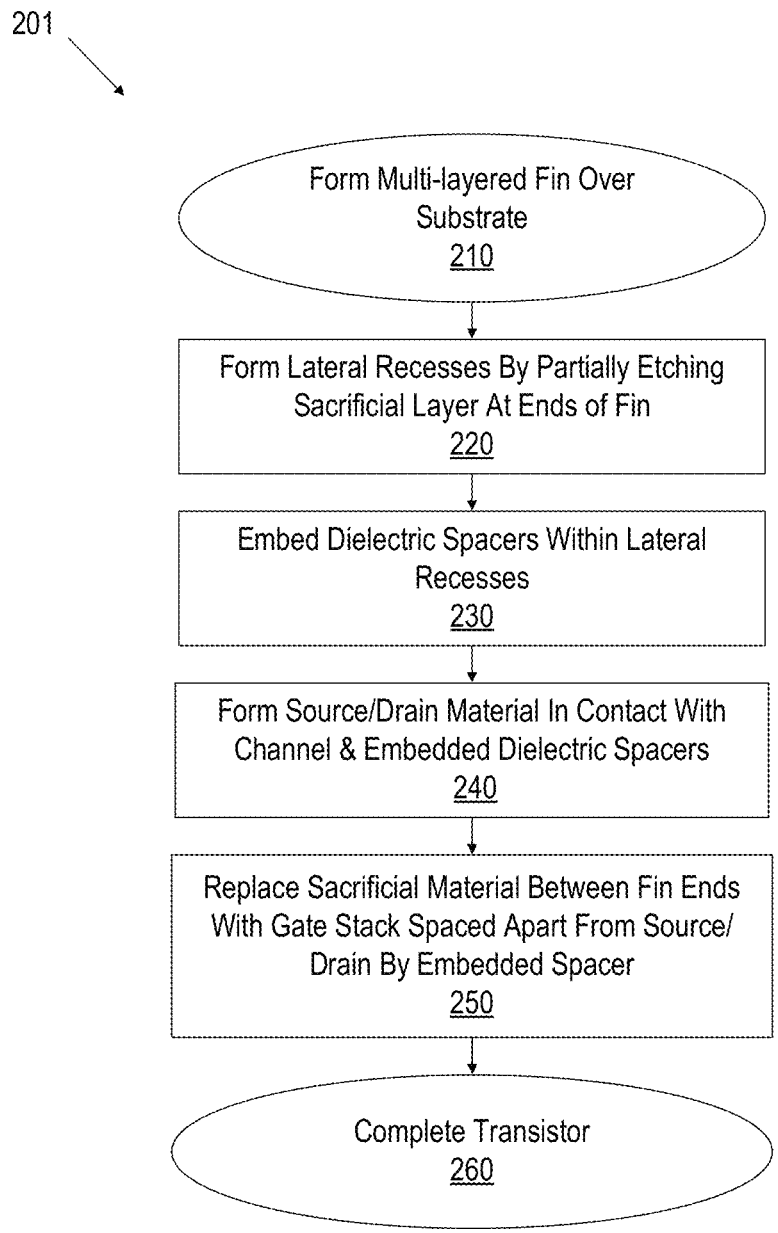
FIGS. 2 and 3 are flow diagrams illustrating methods for fabricating a nanowire transistor including embedded dielectric spacers, in accordance with some embodiments.
Figure 3:
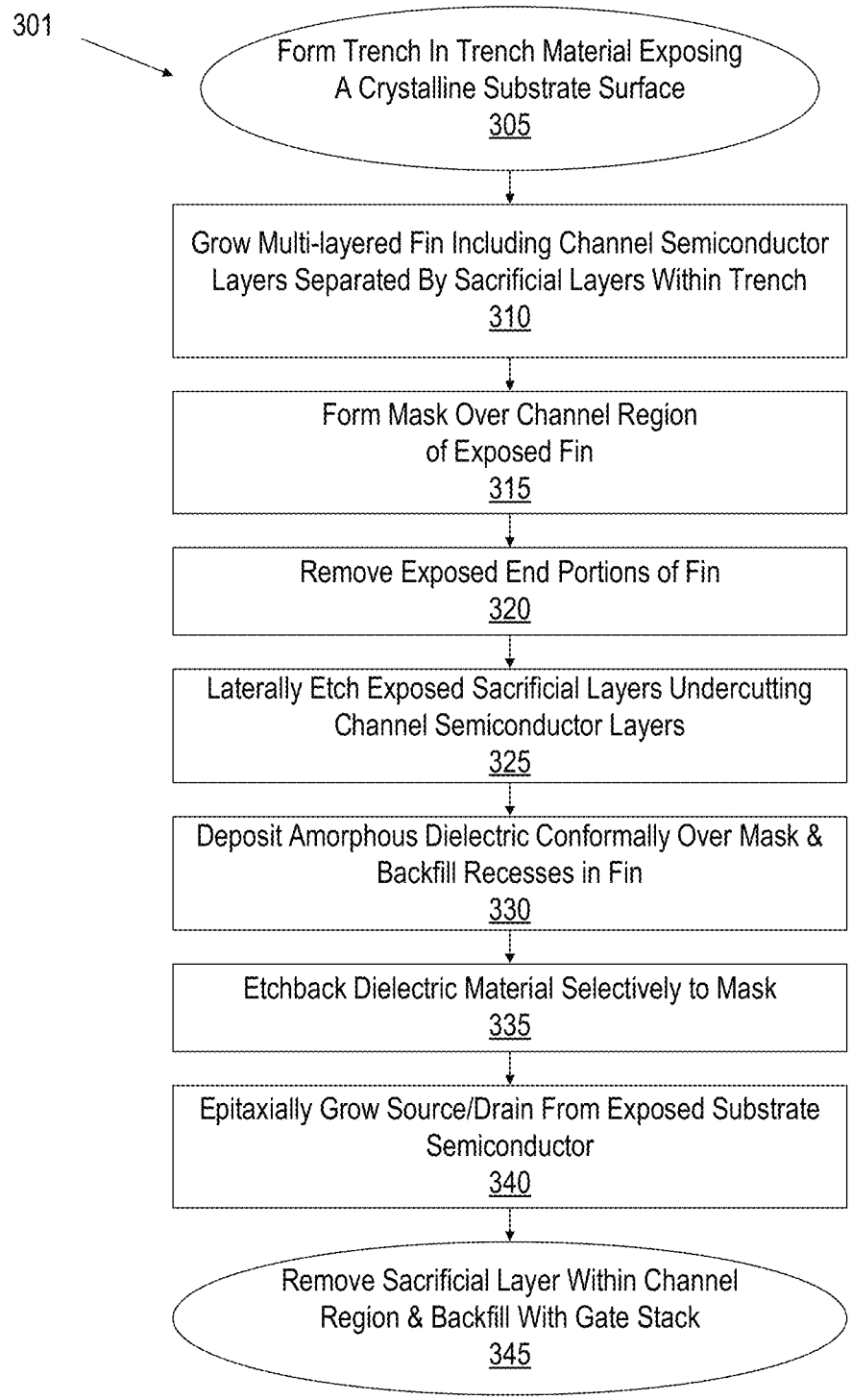

The nanowire transistor structures including embedded dielectric spacers described above may be fabricated by a variety of methods practicing a variety of techniques. FIG. 2 and FIG. 3 are flow diagrams illustrating methods 201, 301 for fabricating a nanowire transistor including embedded dielectric spacers, in accordance with some embodiments. Method 301 may be considered a specific implementation of method 201. The description of method 201 provides an overview, and the description of method 301 describes some exemplary techniques for fabricating transistor 101 (FIG. 1A-1B).

Referring first to FIG. 2, method 201 begins with receiving a multi-layered fin disposed over a substrate at operation 210. Any known processing may be performed upstream of method 201 to arrive at the multi-layered fin structure received at operation 210. In some embodiments, the multi-layered fin includes one or more non-sacrificial semiconductor layer that is to become the semiconductor wire(s) or filament(s) of a nanowire transistor. A non-sacrificial semiconductor layer is disposed on a sacrificial layer that is to be removed at least within a channel region to enable the gate stack to wrap completely around the non-sacrificial semiconductor layer, for example extending between the non-sacrificial semiconductor filament and the substrate.

At operation 220, lateral recesses in the fin are formed by partially etching the sacrificial layer at opposite ends of the fin. The etching is selective to the non-sacrificial semiconductor layer(s) such that ends of the sacrificial semiconductor layer(s) recess relative to ends of the non-sacrificial semiconductor layer(s). Method 201 continues at operation 230 where a dielectric material is embedded with the lateral recesses. This dielectric material may for example serve as the embedded spacer, or at least a mandrel for a lateral spacing that is to remain between the gate electrode and source/drain. Any deposition and/or etch back process may be employed at operation 230 to backfill the lateral recesses formed at the ends of the fin with dielectric material. Exemplary techniques include selective depositions and/or oxidations. Other exemplary techniques include non-selective depositions with a selective (e.g., anisotropic) etch back. The basis for selectivity may be one or more of compositional differences between the sacrificial layer(s) and non-sacrificial semiconductor layer(s), and/or solid-angle shadowing in processing with directional species.

With the lateral recesses backfilled, method 201 continues at operation 240 where source/drain material is formed. The source/drain material is formed on one or more surface of the semiconductor filament(s). For example, the source/drain material may be formed in contact with a surface of end portions of the non-sacrificial semiconductor. The source/drain material may also be formed in contact with the embedded dielectric spacer. Any deposition process known to be suitable for depositing any of the semiconductor source/drain materials described above may be employed at operation 240. In some advantageous embodiments, single crystalline source/drain semiconductor is epitaxially grown at operation 240. Any epitaxial growth technique known to be suitable for the source/drain material may be employed, such as, but not limited to, metal-organic chemical vapor deposition (MOCVD), molecular beam epitaxy (MBE), or hydride vapor phase epitaxy (HYPE).

Method 201 proceeds to operation 250 where material of the sacrificial layer(s) disposed between the fin ends (i.e., disposed between the embedded dielectrics) is replaced with the gate stack. Sacrificial layer removal may entail any known selective etch process that will retain the non-sacrificial filament. In advantageous embodiments, the removal of the sacrificial layer is also selective to the embedded dielectric material so that the embedded dielectric material is retained at ends of the fin. Any gate dielectric deposition process capable of high conformality may then be employed to deposit one or more gate dielectric materials on surfaces of the non-sacrificial semiconductor filament, and potentially on at least one surface of the embedded spacer. In some embodiments, atomic layer deposition (ALD) is employed to deposit one or more of the gate dielectrics described above. A conformal metal deposition process may then be employed to backfill a void between the non-sacrificial semiconductor filament and the substrate where the sacrificial material was removed. Method 201 is then completed at operation 250 where any known ILD deposition, planarization, contact metallization, and backend processing (e.g., forming levels of metal interconnects) may be performed.

In reference to FIG. 3, method 301 provides further description in the context of some exemplary multi-layered nanowire embodiments. FIG. 4, 5, 6, 7, 8A, 8B, 9A, 9B, 10, 11, 12, and 13 are isometric sectional views of nanowire transistor 101 evolving as various operations in method 301 are performed, in accordance with some embodiments. Reference numbers introduced in the description of transistor 101 are retained for features that appear both in FIG. 1A, 1B and in FIG. 4-13.

Referring first to FIG. 3, method 301 beings with forming a multi-layered heteroepitaxial fin structure. In the exemplary embodiment, aspect ratio trapping (ART) is utilized to achieve acceptable crystal quality in the heteroepitaxial fin material. The ART technique described herein in the context of operations 305 and 310 is an example of additive heteroepitaxial fin fabrication, which may advantageously reduce the effects of thermal and/or lattice mismatch across various heterojunctions. In alternative embodiments, a conventional subtractive technique may be employed in which a blanket epitaxial film stack grown over the substrate (or bonded/transferred to the substrate) is etched into fin structures similarly amenable to subsequent operations of method 301.

At operation 305, a trench is formed in a trench material disposed over the substrate. The trench may be etched completely through a z-thickness of the trench material, exposing a crystalline semiconductor region that is to seed a subsequent epitaxial growth. The trench material may be any dielectric material known to be suitable as a field isolation or shallow trench isolation material, such as, but not limited to, silicon dioxide, or other materials with a lower relative permittivity. Although dimensions of trench may vary, the aspect ratio (z-dimension:x-dimension) is advantageously at least 2:1 and more advantageously 3:1, or more. In some embodiments, the trench has a CD of between 5 and 200 nm. However, trench material z-thickness and CD may be scaled as needed to maintain a workable aspect ratio for a predetermined fin height selected for a stack comprising a predetermined number of semiconductor wires or filaments.

Method 301 continues at operation 310 where a multi-layered fin including both non-sacrificial (channel) semiconductor layers and sacrificial semiconductor layers intervening between the non-sacrificial layers are grown within the trench. In advantageous embodiments, the multi-layered fin is monocrystalline comprising a sacrificial material epitaxially grown from the substrate surface exposed at the bottom of the trench. Any epitaxial growth technique, such as, but not limited to, MOCVD, MBE, or HYPE may be utilized at operation 310. Growth of the fin is selective to the substrate seeding surface, backfilling the trench in the surrounding amorphous trench material. At operation 310, feed gases and other epitaxial process control parameters (e.g., temperature, partial pressures, etc.) are changed to epitaxially grow multiple layers of fin material from the semiconductor surface still contained within the trench. Multiple heterojunctions between non-sacrificial layers and sacrificial layers may be formed in a continuous manner with an in-situ change in growth parameters following any known technique. A polish may be performed at operation 310 to planarize a top surface of the multi-layered fin with a top surface of the surrounding dielectric.

Figure 4:
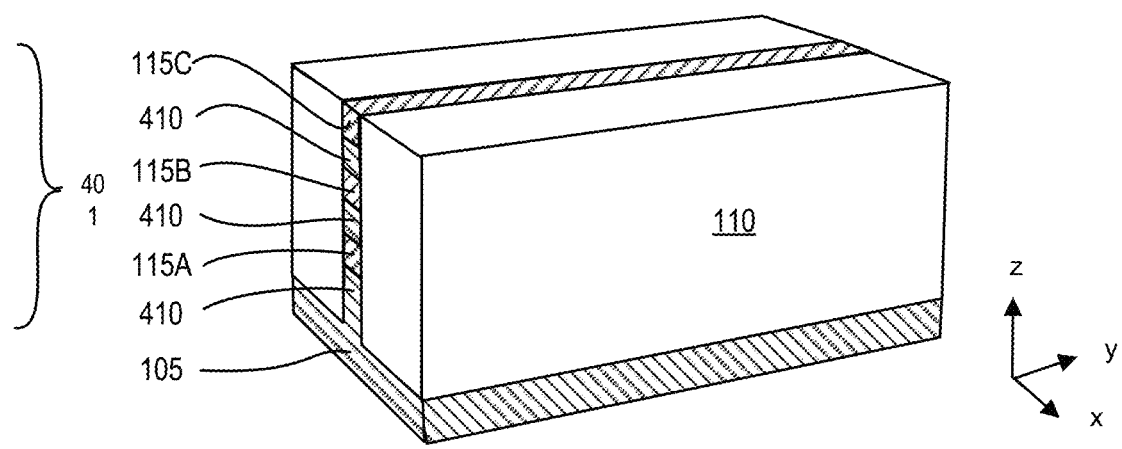
FIGS. 4, 5, 6, 7, 8A, 8B, 9A, 9B, 10, 11, 12, and 13 are isometric sectional views of nanowire transistor structures evolving as various operations in the method illustrated in FIG. 3 are performed, in accordance with some embodiments.
Figure 5:
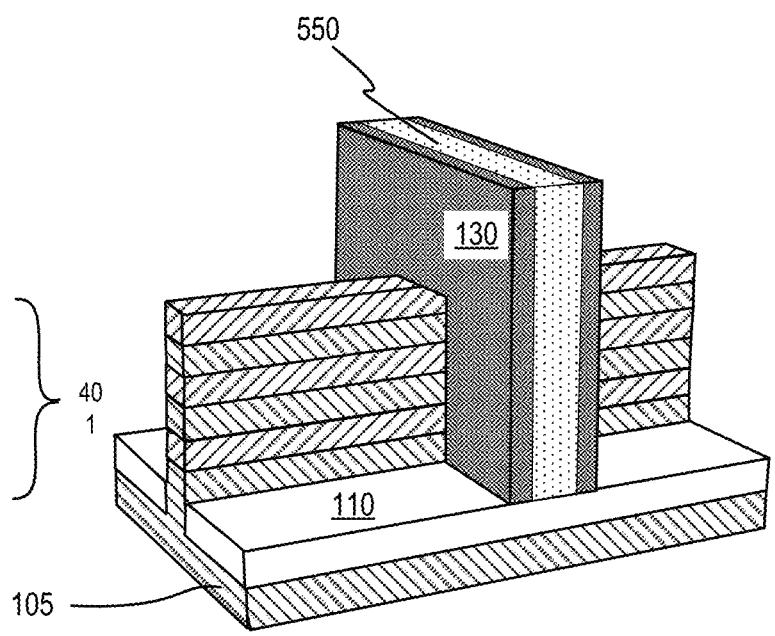
Figure 6:
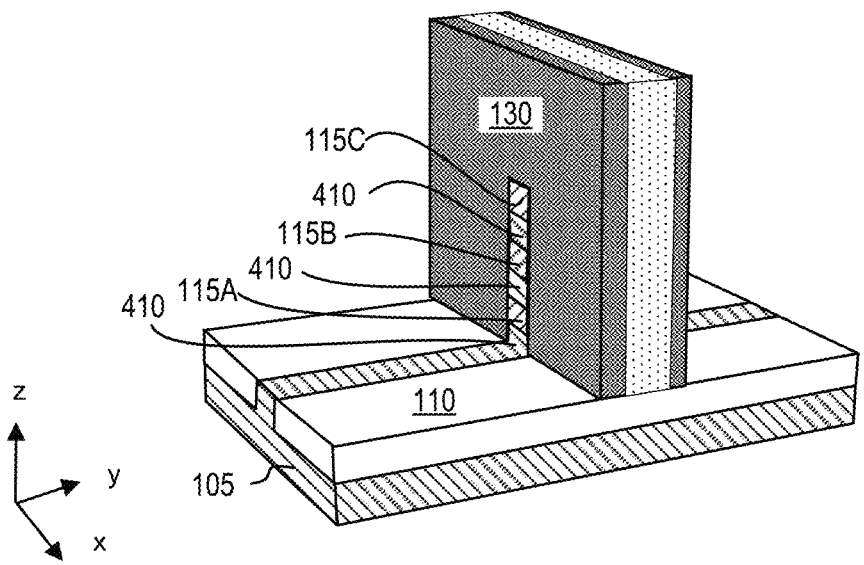
Figure 7:
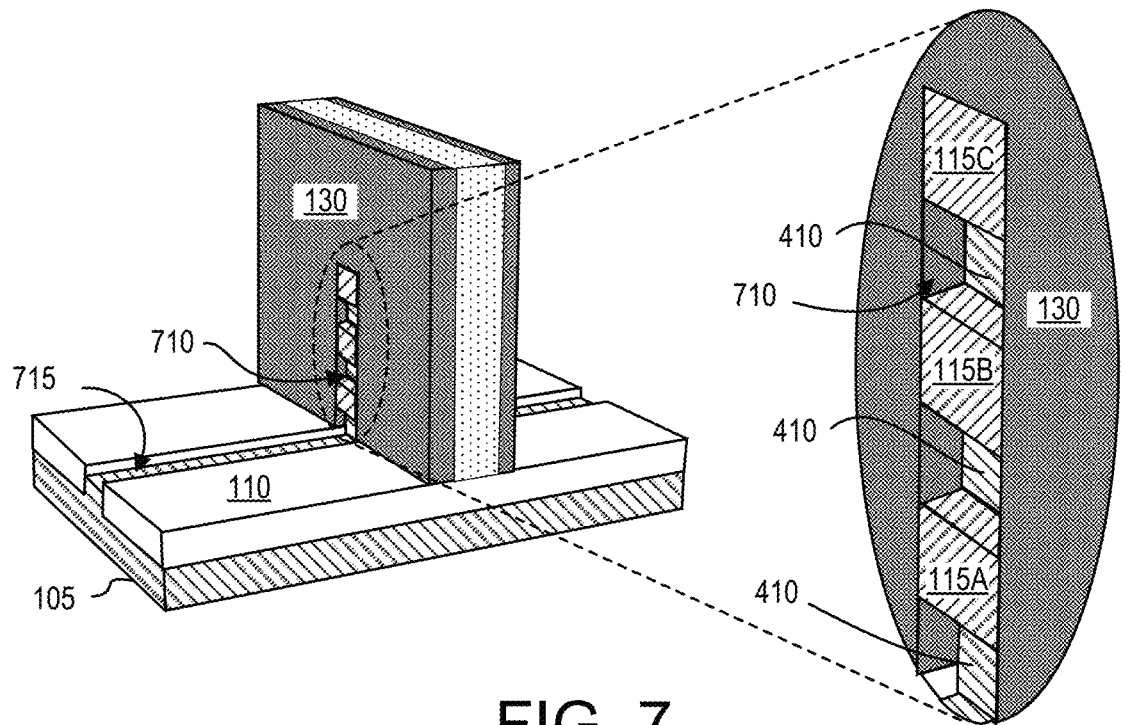

FIG. 4 illustrates an isometric view of an exemplary multi-layered fin 401 grown within a trench in isolation dielectric material 110. Multi-layered fin 401 includes semiconductor filaments 115A, 115B, and 115C separated from the each other by an intervening sacrificial semiconductor layer 410. Sacrificial semiconductor layer 410 is further disposed between semiconductor filament 115A and substrate 105. Sacrificial semiconductor layer 410 may have the same composition as substrate 105, or may be a different semiconductor. In some embodiments where filaments 115-115C are Ge, sacrificial semiconductor layer 410 is a SiGe alloy. In some embodiments were filaments 115A-115C are Si, sacrificial semiconductor layer 410 is a SiGe alloy. In some embodiments were filaments 115A-115C are a first III-V alloy, sacrificial semiconductor layer 410 is a second III-V alloy.

After epitaxial fin growth, the surrounding trench material may be recessed to a desired level to expose sidewalls of the fin material, and method 301 continues at operation 315 where a mask is formed over what is to become the channel region. In some embodiments, the mask formed at operation 315 is a gate stack mandrel, or sacrificial gate stack. Any known sacrificial gate structure and fabrication techniques may be employed at operation 315. In some embodiments, operation 315 entails a dielectric deposition and planarization, as well as patterning an opening in the dielectric exposing the fin structure, and backfilling the opening with a sacrificial gate. In alternative embodiments, sacrificial gate material is blanket deposited and patterned into gate mandrel stripes. In the example illustrated in FIG. 5, after recessing a top surface of isolation dielectric 110, a gate stack mandrel including sacrificial gate 550 (e.g., polysilicon) is formed over multi-layered fin 401 using any conventional techniques. Sacrificial gate 550 is formed on at least two sidewalls of multi-layered fin 401 and extends laterally over isolation dielectric 110. The mask formed at operation 315 further includes external spacer dielectric 130. Any conventional technique may be employed to form external spacer dielectric 130, such as, but not limited to, a blanket conformal deposition of dielectric material layer followed by an anisotropic etch back of the dielectric layer to retain external spacer dielectric 130 along topographic features. Any of the materials described above for external spacer dielectric 130 may be deposited, such as, but not limited to SiC, SiCN, SiOC, SiO, and SiN. For the embodiment depicted in FIG. 5, external spacer dielectric 130 is disposed on sidewalls of gate stack mandrel. Although not depicted in FIG. 5, external spacer dielectric 130 may also be disposed on sidewalls of multi-layered fin 401.

Method 301 (FIG. 3) proceeds to operation 320 where unmasked (exposed) end portions of the fin are removed. Any etch process selective to the multi-layer fin materials over the mask formed at operation 320 may be employed to remove end portions of the fin self-aligned to the mask. In the example illustrated in FIG. 6, portions of multi-layered fin 401 unprotected by sacrificial gate 550 and external spacer 130 are removed selectively to both sacrificial gate 550 and external spacer 130. In advantageous embodiments, an anisotropic etch is employed to remove portions of multi-layered fin 401 in alignment with a surface of external spacer 130. For an example where semiconductor filaments 115A-115C comprise Ge and sacrificial layers 410 comprise SiGe, operation 320 may entail a directional plasma etch and/or crystallographic wet etch. Upon completing operation 320, a semiconductor region of substrate 105 is exposed, end faces of sacrificial semiconductor layer 410 and semiconductor filaments 115A-C are also exposed. At this point, filaments 115A-115C have a lateral length (e.g., in the y-dimension) that only includes a channel region protected by sacrificial gate 550 and end portions protected by external spacer 130.

Returning to FIG. 3, method 301 continues at operation 325 where the exposed end faces of the sacrificial layer(s) are laterally etched, recessing the sacrificial material and undercutting end portions of the non-sacrificial channel semiconductor layers. Any etch process selective to the sacrificial layer material over the non-sacrificial material may be employed to recess end portions of the sacrificial layer(s) in a self-aligned manner relative to the mask sidewalls. In the example illustrated in FIG. 7, sacrificial layers 410 are recessed selectively to the exposed surface of external spacer 130, forming recesses 710. In advantageous embodiments, an isotropic etch is employed. For some embodiments where semiconductor filaments 115A-C comprise Ge and sacrificial layers 410 comprise SiGe, operation 325 may entail a chemical etch employing an alkaline etchant (e.g., 3-10% TMAH solution, which is selective to many SiGe alloys). Upon completing operation 325, end portions of sacrificial semiconductor layer 410 have been removed. These end portions remove may have a lateral length (e.g., in y-dimension) substantially equal to that of external spacer 130. For example, where external spacer 130 has a thickness of 1-5 nm, sacrificial layers have a lateral length reduced from that of filaments 115A-115C by 1-5 nm at each each end.

In some embodiments, recessing the sacrificial layers also recesses a top semiconductor surface of the substrate relative to a top surface of surrounding regions of (field) isolation dielectric. For example, as further illustrated in FIG. 7, top surface 715 of exposed substrate semiconductor region 105 is recessed below a top surface of dielectric 110 by substantially the same amount as the sacrificial layers are laterally recessed (e.g., 1-5 nm).

Following the recess etching, the embedded spacer is formed. In some embodiments, embedded spacer formation entails adding a second dielectric layer over an external dielectric spacer portion of the channel mask, and then etching back the second dielectric material layer selectively to the external dielectric spacer. Such a technique retains the original external dielectric spacer as well as embed spacer material within the recessed regions. In some alternative embodiments, embedded spacer formation entails replacing an external spacer portion of the channel mask with a new external spacer that also backfills the recessed end portions of the fin. For the latter embodiments, replacing the external spacer may begin with an isotropic etch to remove the external spacer, laterally reducing the channel mask width and exposing sidewalls of end portions of the non-sacrificial semiconductor filaments. Any etchant known to be suitable for etching the external dielectric spacer may be employed for this purpose.

Figure 8A:
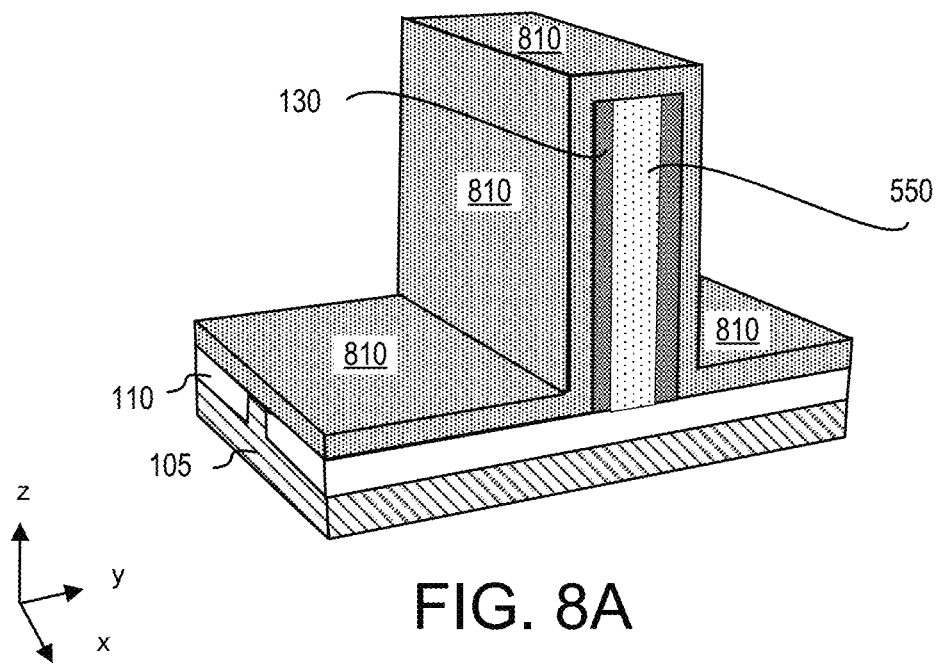
Figure 8B:
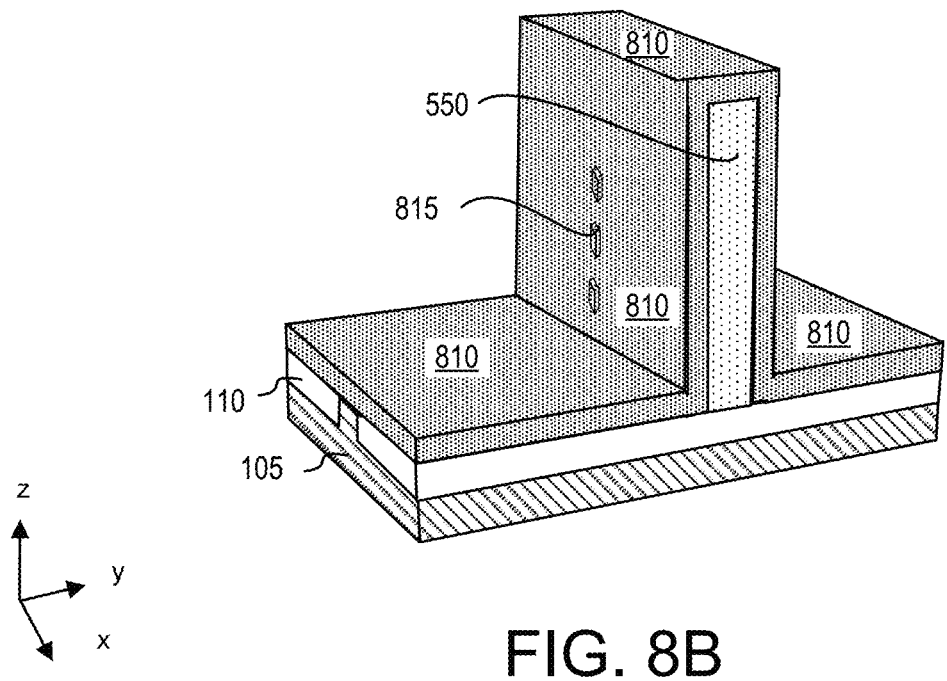

Method 301 then continues at operation 330 where an amorphous dielectric material is conformally deposited over the channel region mask. The conformal deposition further backfills the lateral recesses in the multi-layered fin. Although any conventional deposition technique may be employed, in advantageous embodiments material with a low relative permittivity (k) is deposited by ALD to completely backfill or embed the dielectric material within the lateral recesses. In the example illustrated in FIG. 8A, amorphous dielectric material 810 is blanket deposited over sacrificial gate 550 and over external spacer 130. In the example illustrated in FIG. 8B, amorphous dielectric material 810 is blanket deposited over sacrificial gate 550 after external spacer 130 has been removed. As shown in FIG. 8B, some topography 815 resulting from end portions of semiconductor filaments 115A-115C may be visible at this stage of fabrication. For either of the embodiments illustrated in FIGS. 8A and 8B, amorphous dielectric material 810 may be any of the exemplary materials described above for embedded spacer 120 (e.g., SiC, SiOC, SiCN, SiN, HSQ, MSQ). In some examples, dielectric material 810 has a low relative permittivity (e.g., lower than that of external spacer 130). In some further embodiments, dielectric material 810 has a relative permittivity below 4, and more advantageously below 3.

Figure 9A:
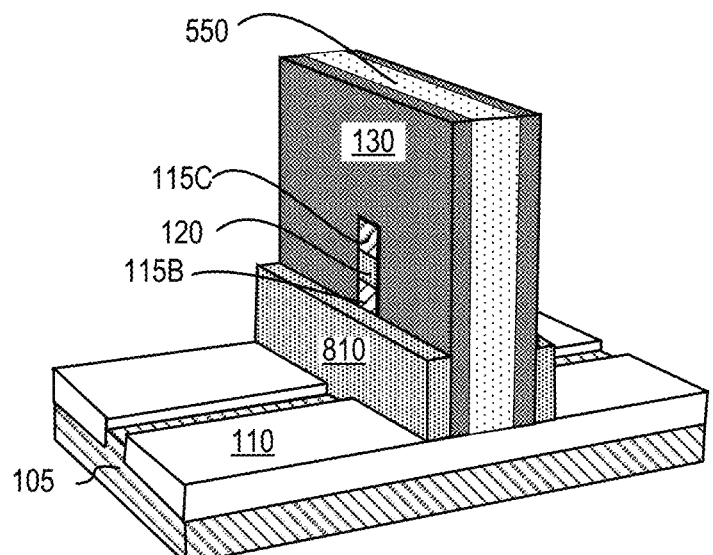

Method 301 continues with operation 335 where the dielectric material deposited at operation 330 is etched back selectively relative to the channel mask. The etch back process is to retain dielectric material with in the recesses. The etch back may further regenerate an external spacer, or remove all of the dielectric material deposited at operation 330 selectively to an existing external spacer, retaining only a portion of dielectric material embedded in the recesses. The etch back for the former may be of shorter duration than for the latter. FIG. 9A illustrates one exemplary embodiment where dielectric material 810 was deposited over external spacer 130. An anisotropic etch of dielectric layer 810 is performed to recess the dielectric layer 810 the full height (e.g., z-dimension) of external spacer 130. In FIG. 9A, about three-fourths of the etch of dielectric layer 810 has been completed to illustrate how embedded dielectric 120 remains as the etch front reduces a height of the dielectric layer 810 against the sidewall of external spacer 130. For such embodiments, external spacer 130 ideally has a sufficiently different composition from that of dielectric layer 810 to facilitate high etch selectivity.

Figure 9B:
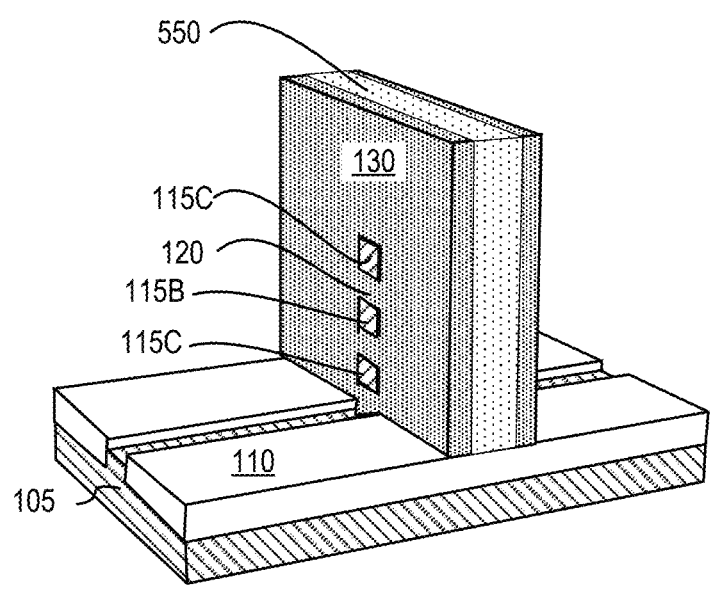
Figure 10:
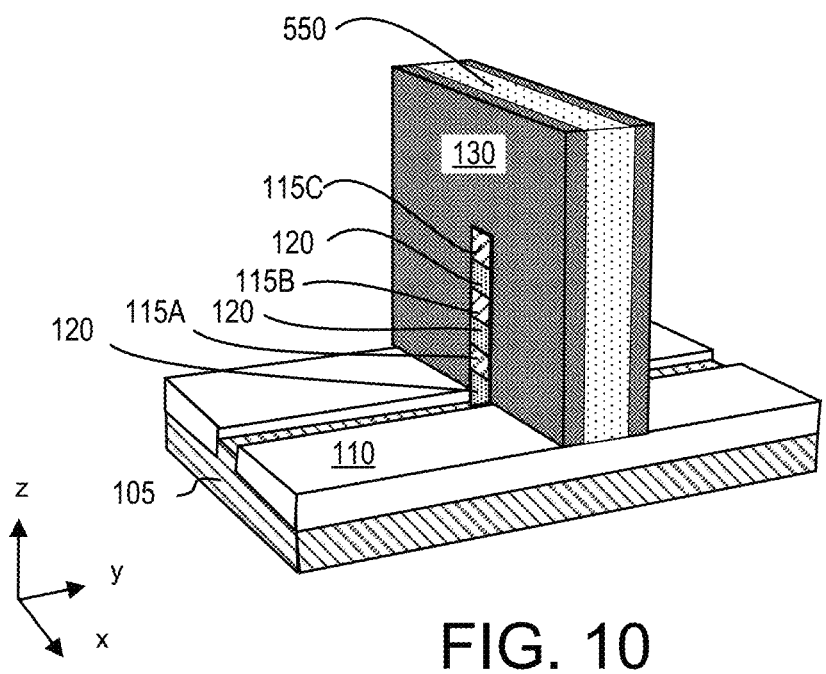
Figure 11:
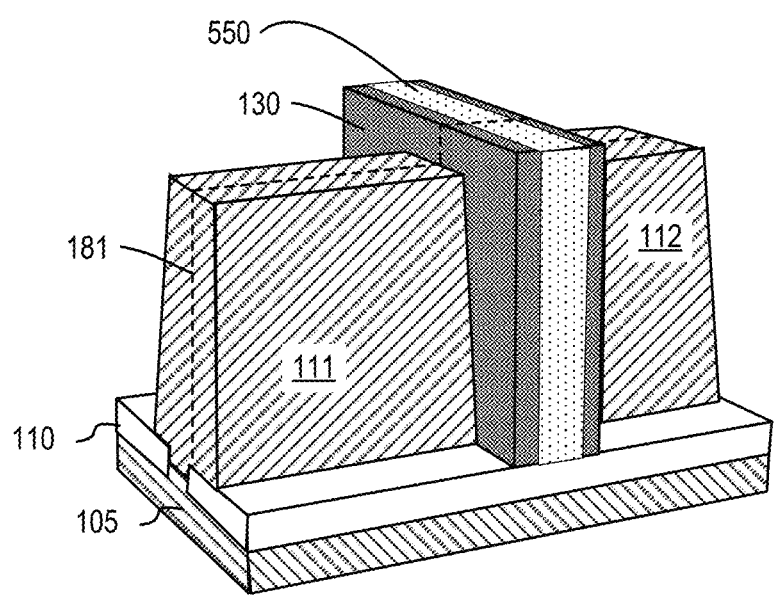

FIG. 9B illustrates some exemplary embodiments where dielectric material 810 has been deposited over sacrificial gate 550 after external spacer 130 was removed, for example with an isotropic (e.g., wet acid) etchant that will also remove any stringers that surrounded the fin structure. Operation 330 then entails anisotropic etch of dielectric layer 810, but limited only to the duration needed to recess the dielectric layer 810 the full height (e.g., z-dimension) of a semiconductor filament 115A-C, re-exposing end faces of semiconductor filaments 115A-C. As shown in FIG. 9B, the anisotropic etch of dielectric layer 810 has re-generated external spacer 130, in effect expanding the external dielectric spacer to include internal spacer 120. Material composition of external spacer 130 may also be modified from its initial state as a result of the external spacer replacement process.

Independent of whether the external spacer was replaced or merely filled-in with embedded spacer dielectric material, method 301 continues at operation 340 where source and drain semiconductor crystals are epitaxially grown from an exposed substrate semiconductor surface. Epitaxial growth of source/drain crystals may utilize any known techniques, such as, but not limited to MOCVD or MBE. In some embodiments, a pseudomorphic source/drain crystal is grown. For example, a Ge source and drain crystal may be grown on a silicon or SiGe substrate semiconductor surface. In other embodiments, a source and drain crystal of a first III-V alloy is grown on a substrate semiconductor surface of a second, different, III-V alloy. In-situ doping may be employed during the growth operation 340 to achieve as high impurity dopant concentration as possible for lowest contact resistance. In the example illustrated in FIG. 11, source and drain crystals 111, 112 are grown from a surface of semiconductor substrate 105, making intimate contact with end faces of each of semiconductor filaments 115A-115C, completely embedding internal spacer 120, and/or partially covering a portion of external spacer 130.

Figure 12:
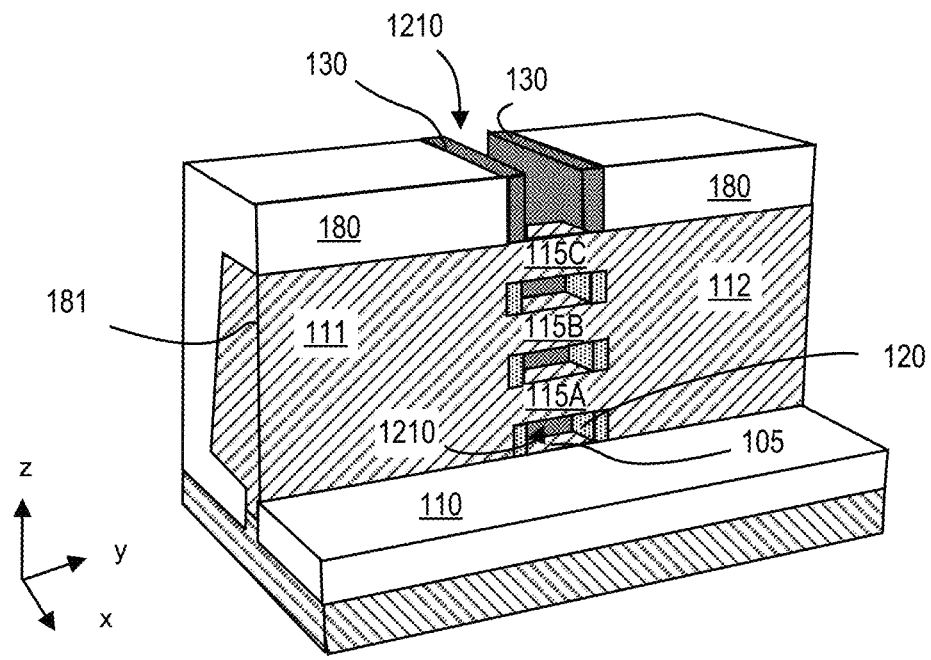
Figure 13:
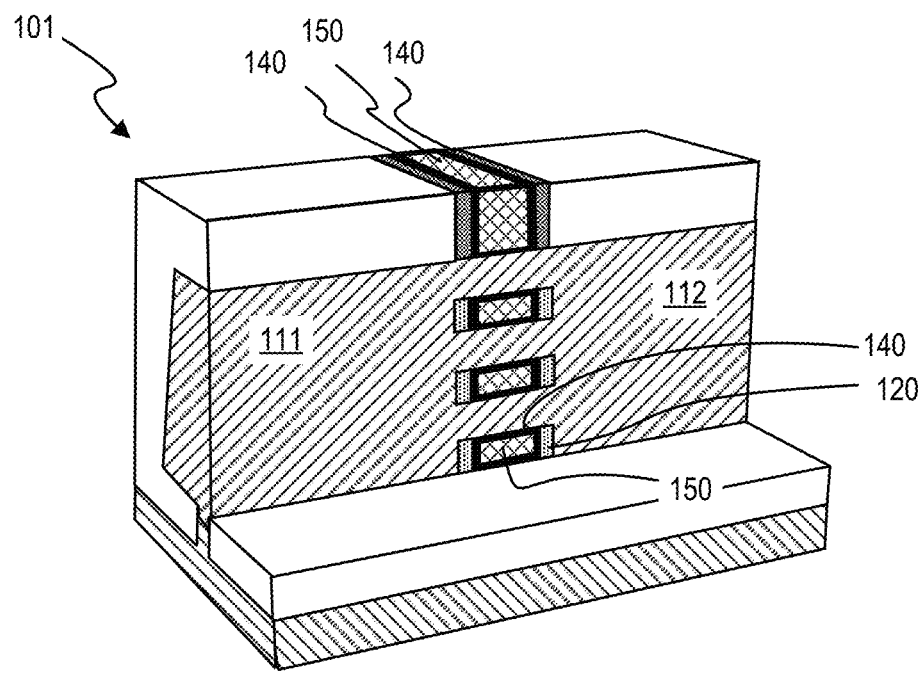

Method 301 (FIG. 3) continues at operation 345 where the channel mask, and the remaining sacrificial layer(s) are removed selectively over the non-sacrificial semiconductor layer(s). Gate stack materials are then backfilled over the lateral length of the exposed channel region. A gate dielectric material is deposited on sidewalls of the embedded spacer as well as fully surrounding the non-sacrificial semiconductor layer(s). A gate electrode material is deposited over the gate dielectric material, ideally backfilling any voids between the semiconductor filaments and/or between the semiconductor filament and the substrate. Any known deposition processes may be employed in the formation of the final gate stack, such as ALD, for example. Prior to gate stack formation, an ILD may be deposited over the source/drain and planarized with the channel mask. FIG. 12 is an isometric sectional drawing illustrating internal features visible along plane 181 in FIG. 11. In some embodiments exemplified by FIG. 12, ILD 180 is planarized with a top surface of sacrificial gate 550, which is subsequently removed selectively to expose semiconductor filaments 115A-115C. Upon removal of sacrificial gate 550, a passage 1210 extending between filament 115A and substrate 105 is opened. Similar passages extending between stacked filaments are also currently opened. A sidewall of embedded spacer 120 is exposed within each passage. FIG. 13 further illustrates nanowire transistor 101 following deposition of a gate stack including gate dielectric 140 and gate electrode 150, arriving at the structure introduced in FIGS. 1A and 1B. Gate dielectric 140 is deposited on all surfaces of passage 1210, insulating gate electrode 150 from filaments 115A-115C and substrate semiconductor region 105. Gate electrode 150 backfills passage 1210, joining portions of gate electrode material strapping over opposite sidewalls of filaments 115A-115C.

Following formation of the final gate stack, transistor 101 is substantially complete. Transistor 101 may then be electrically interconnected with other transistors into integrated circuitry through any known source/drain and gate contact metallization.

FIG. 13 illustrates a system in which a mobile computing platform 1305 and/or a data server machine 13206 including a nanowire transistor with an embedded spacer, for example in accordance with embodiments described above. The server machine 1306 may be any commercial server, for example including any number of high-performance computing platforms disposed within a rack and networked together for electronic data processing, which in the exemplary embodiment includes a packaged device 1350.

The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen) 1311, a chip-level or package-level integrated system 1310, and a battery 1315. In some embodiments, display screen 1311 a nanowire transistor with an embedded spacer, in accordance with embodiments described above.

Whether disposed within an integrated system 1310 illustrated in the expanded view 1320, or as a stand-alone packaged device within the server machine 1306, an SOC 1360 includes a nanowire transistor with an embedded spacer, in accordance with embodiments described above. SOC 1360 may further include a memory circuitry and/or a processor circuitry 1340 (e.g., SRAM, a microprocessor, a multi-core microprocessor, graphics processor, etc.) electrically coupled through multi-layered graphene-based interconnects. Any of controller 1335, PMIC 1330, or RF (radio frequency) integrated circuitry (RFIC) 1325 may include a nanowire transistor with an embedded spacer, in accordance with embodiments described above.

As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 14:
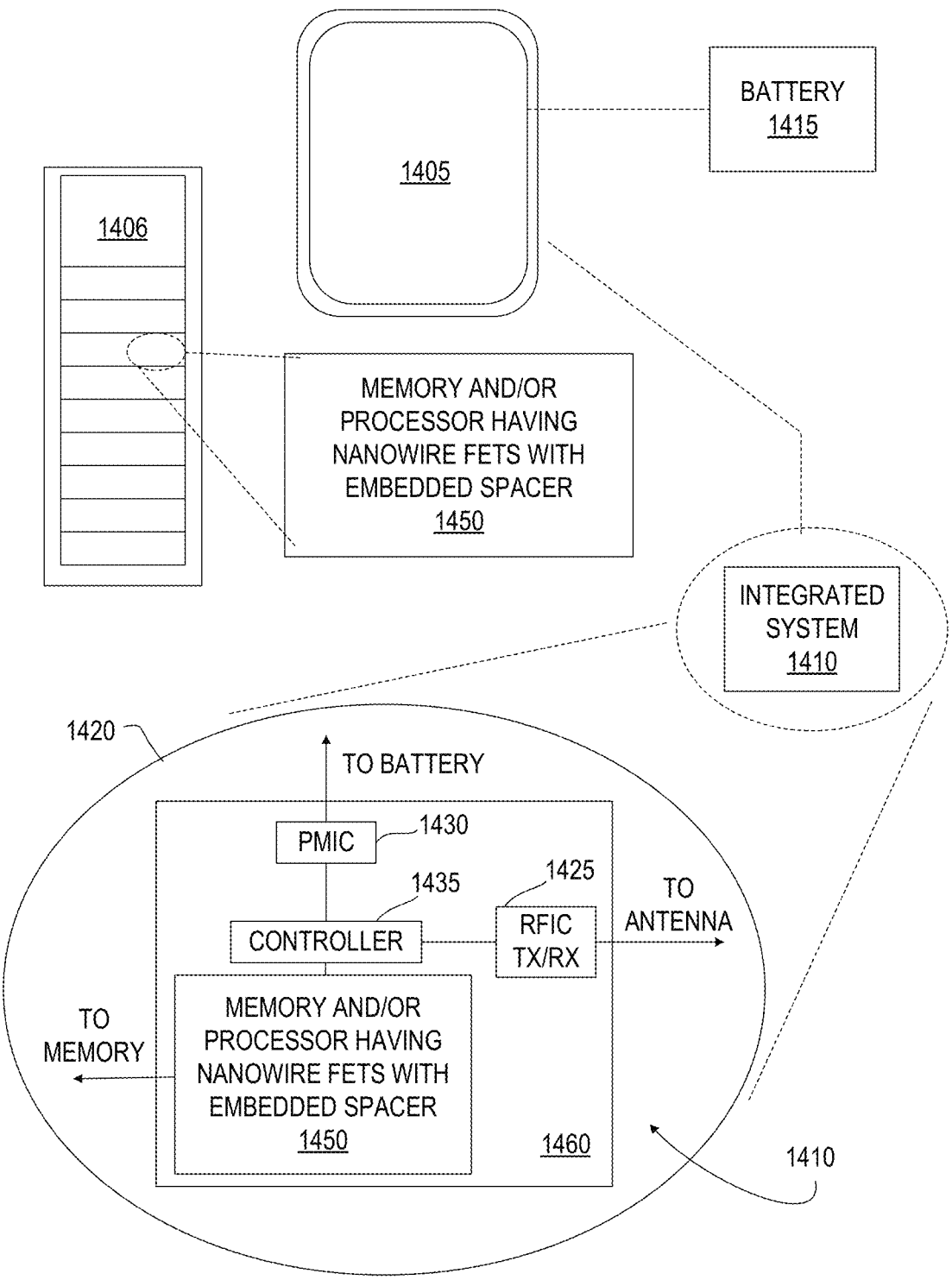
FIG. 14 is a schematic illustrating a mobile computing platform and a data server machine employing nanowire transistors including embedded dielectric spacers, in accordance with embodiments.
Figure 15:
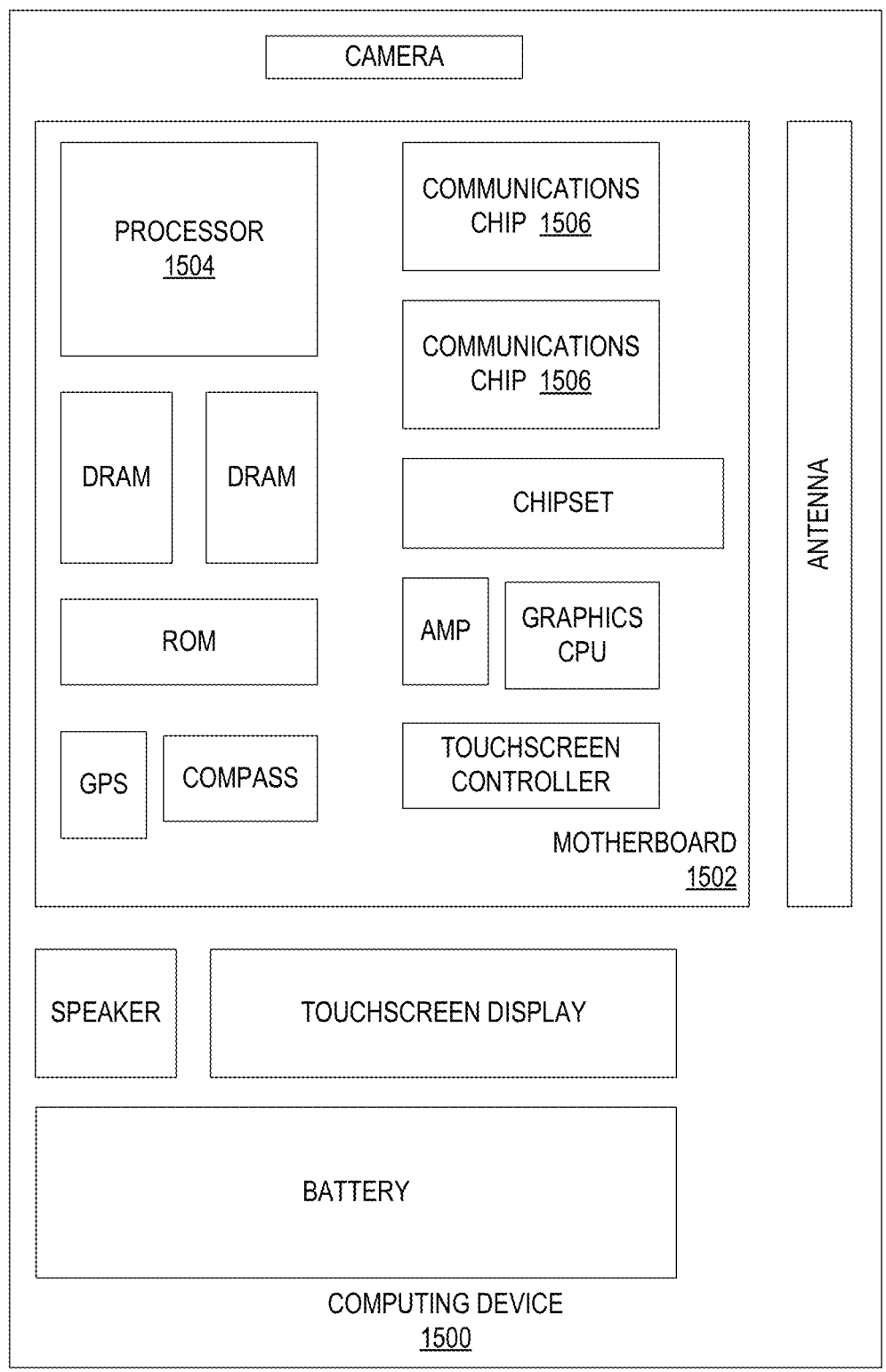
FIG. 15 is a functional block diagram illustrating an electronic computing device, in accordance with some embodiments.

FIG. 14 is a functional block diagram of a computing device 1400, arranged in accordance with at least some implementations of the present disclosure. Computing device 1400 may be found inside mobile platform 1305 or server machine 1306, for example. Device 1400 further includes a motherboard 1402 hosting a number of components, such as, but not limited to, a processor 1404 (e.g., an applications processor), which may further incorporate embedded graphene-based TFETs including one or more molecular graphene unit, for example in accordance with embodiments described above. Processor 1404 may be physically and/or electrically coupled to motherboard 1402. In some examples, processor 1404 includes an integrated circuit die packaged within the processor 1404. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1300 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments not limited to the illustrative embodiments described in detail herein, but can be practiced with modification and alteration without departing from the scope of the appended claims. For example the above embodiments may include specific combinations of features as further provided below:

In one or more first embodiments, a nanowire transistor comprises a substrate, a first semiconductor filament extending a first lateral length between a source and a drain disposed over the substrate, a gate stack disposed between the first filament and the substrate within a channel portion of the first lateral length, the gate stack comprising a gate electrode material separated from the first filament by a gate dielectric material, and a pair of embedded dielectric spacers disposed between the first filament and the substrate within end portions of the first lateral length, and separating the gate stack from the source and the drain.

In furtherance of the first embodiments, the transistor further comprises a second semiconductor filament disposed over the first filament and extending the first lateral length between the source and the drain, and the gate stack is further disposed between the first and second filaments with the gate dielectric separating the gate electrode material from the first and second filaments, and the embedded spacers are further disposed between the first and second filaments within the end portions of the first lateral length.

In furtherance of the first embodiments, the embedded dielectric spacers comprise an amorphous dielectric material having a bulk relative permittivity below 3.5.

In furtherance of the first embodiments, the gate stack is further disposed over a top surface of the first filament, opposite the substrate, and extends a second lateral length beyond the first filament in a direction orthogonal to the first lateral length, and external dielectric spacers having the second lateral length are disposed over the top filament surface and over opposite sidewalls of the filament separating the gate electrode from the source and the drain.

In furtherance of the first embodiments, the external dielectric spacers contact a first and second sidewall of the embedded dielectric spacers, the gate dielectric material contacts a third sidewall of the embedded dielectric spacers, and the source or drain contacts a fourth sidewall of the embedded dielectric spacers.

In furtherance of the first embodiments immediately above, the external dielectric spacers separate the gate electrode from the source and the drain by a distance substantially equal to a distance by which the embedded dielectric spacers separate the gate electrode from the source and drain.

In furtherance of the first embodiments immediately above, the end portions each comprise less than 4 nm of the first lateral length, and the external dielectric spacers separate the gate stack from the source and the drain by no more than 4 nm.

In furtherance of the first embodiments immediately above, the external dielectric spacers comprise an amorphous dielectric material having a first composition, and the embedded dielectric spacers comprise an amorphous dielectric material having a second composition, different than the first.

In furtherance of the first embodiments immediately above, the embedded dielectric spacers comprise a material having a lower relative permittivity than that of the external dielectric spacer.

In furtherance of the first embodiments, the first semiconductor filament is disposed over a crystalline semiconductor region of the substrate surrounded by an amorphous dielectric region of the substrate, the source and drain each comprise heavily-doped semiconductor crystals in contact with the crystalline semiconductor region, and an interface between the crystalline semiconductor region and the source and drain crystals is disposed below a top surface of the isolation dielectric region.

In furtherance of the first embodiments immediately above, the interface between the crystalline semiconductor region and the source and drain crystals is disposed below the top surface of the isolation dielectric region by at least a distance equal to one of the end portions of the first lateral length.

In furtherance of the first embodiments, the semiconductor filament is a crystal of Ge or a III-V compound, the source and drain each comprise a heavily-doped crystal of Ge or a III-V compound, the gate dielectric material is selected from the group consisting of $HfO_2$, $Al_2O_3$, $HfSiO_x$, $HfAlO_x$, and $TaSiO_x$, and the gate electrode material comprises one or more metal.

In furtherance of the first embodiments immediately above, the semiconductor filament comprises a crystal of Ge, and the source and drain are both doped with acceptor impurities.

In one or more second embodiments, a microprocessor comprises a plurality of nanowire transistors, each nanowire transistor further comprising a plurality of semiconductor filaments extending a first lateral length between a source and a drain, a gate stack disposed between the filaments within a channel portion of the first lateral length, the gate stack comprising a gate electrode material separated from the filaments by a gate dielectric material, and embedded dielectric spacers disposed between the filaments within end portions of the first lateral length, and separating the gate stack from the source and the drain.

In furtherance of the second embodiments, the semiconductor filaments in at least a subset of the nanowire transistors comprises a crystal of Ge, and the sources and drains are doped with acceptor impurities.

In one or more third embodiments, a method of fabricating a nanowire transistor comprises forming a fin over a substrate, the fin comprising a non-sacrificial semiconductor material layer and a sacrificial material layer disposed between the non-sacrificial layer and the substrate. The method includes forming lateral recesses between the non-sacrificial layer and the substrate by partially etching the sacrificial layer at opposite ends of the fin. The method includes embedding a dielectric material within the lateral recesses, and forming source and drain material in contact with the non-sacrificial layer and the embedded dielectric material at ends of the fin, and the method includes replacing a remaining portion of the sacrificial material layer between the ends of the fin with a gate stack comprising a gate electrode material separated from the non-sacrificial semiconductor material by a gate dielectric material and spaced apart from the source and drain material by the embedded dielectric material.

In furtherance of the third embodiments immediately above, forming the fin further comprises forming a mask over the fin protecting the non-sacrificial semiconductor material over a first lateral length of the substrate, and removing unmasked portions of fin by etching the sacrificial and non-sacrificial materials to expose a semiconductor portion of the substrate, and forming the lateral recesses further comprises laterally recessing, relative to edges of the mask, a portion of the sacrificial material selectively to the non-sacrificial material. In the method embedding a dielectric material within the lateral recesses further comprises depositing an amorphous dielectric material over the mask and ends of the fin, the dielectric material backfilling the lateral recesses, and removing the dielectric material from sidewalls of the mask while retaining the dielectric material embedded within the lateral recesses.

In furtherance of the third embodiments immediately above, forming the source and drain further comprises epitaxially growing a source and drain crystal from the semiconductor portion of the substrate and contacting end portions of the non-sacrificial semiconductor material layer, and replacing a remaining portion of the sacrificial material layer with the gate stack further comprises removing at least a portion of the mask to expose a channel portion of the non-sacrificial semiconductor disposed between the end portions, removing the sacrificial material disposed between the non-sacrificial semiconductor and the substrate within the channel portion to form a first semiconductor filament, depositing the gate dielectric material on all exposed surfaces of the semiconductor filament and on a surface of the embedded dielectric, and depositing the gate electrode material on the gate dielectric material in a space between the filament and the substrate.

In furtherance of the third embodiments, depositing the amorphous dielectric material over the mask further comprises conformally depositing a dielectric material having a relative permittivity below 3.5 by atomic layer deposition, and removing the dielectric material from sidewalls of the mask while retaining the dielectric material embedded within the lateral recesses further comprises anisotropically etching through a vertical thickness of the dielectric material disposed on a sidewall of the mask.

In furtherance of the third embodiments, laterally recessing the portion of the sacrificial material forming source and drain material further comprises recessing a top surface of the semiconductor portion of the substrate below a top surface of an isolation dielectric region of the substrate surrounding the semiconductor portion.

In furtherance of the third embodiments, forming the fin further comprises epitaxially growing a multi-layered stack comprising a plurality of non-sacrificial semiconductor layers separated by intervening sacrificial layers, and forming lateral recesses between the non-sacrificial layer and the substrate by partially etching the sacrificial layer at opposite ends of the fin further comprises forming lateral recesses between adjacent non-sacrificial layers of the multi-layered stack by partially etching each of the intervening sacrificial layers.

In furtherance of the third embodiments, epitaxially growing the multi-layered stack further comprises growing a plurality of non-sacrificial Ge or III-V layers separated by intervening sacrificial SiGe or III-V layers.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
 a filament comprising a semiconductor, the filament extending a first lateral length between a source and a drain;
 a gate stack between an underlying substrate and the filament within a channel portion of the first lateral length, the gate stack comprising a gate electrode material separated from the filament by a gate dielectric material; and
 an embedded spacer comprising a dielectric material, the embedded spacer between the filament and the substrate within an end portion of the first lateral length, and the embedded spacer separating the gate stack from the source or the drain, wherein:
 the filament is over a region of the substrate comprising a crystalline semiconductor that is surrounded by an isolation dielectric region of the substrate;
 the source and the drain each comprise doped semiconductor crystals in contact with the crystalline semiconductor region of the substrate; and
 an interface between the crystalline semiconductor region of the substrate and the source and drain crystals is below the top surface of the isolation dielectric region by an amount substantially equal to the end portion of the first lateral length.

2. The transistor structure of claim 1, wherein the filament is a first filament and the transistor further comprises a second filament over the first filament, and extending the first lateral length between the source and the drain, and wherein:

the gate stack is between the first and second filaments with the gate dielectric separating the gate electrode material from the first and second filaments; and the embedded spacer is between the first and second filaments, within the end portion of the first lateral length.

3. The transistor structure of claim 1, wherein the embedded spacer comprises an amorphous dielectric material having a bulk relative permittivity below 3.5.

4. The transistor structure of claim 1, wherein:

the gate stack is over a top surface of the filament, opposite the substrate, and extends a second lateral length beyond the filament in a direction orthogonal to the first lateral length; and the transistor structure further comprises an external spacer comprising a dielectric material, wherein the external spacer extends the second lateral length and is adjacent to a sidewall of the filament separating the gate electrode material from the source or the drain.

5. The transistor structure of claim 4, wherein:

the external spacer contacts a sidewall of the embedded spacer;

the gate dielectric material contacts a sidewall of the embedded spacer; and the source or drain contacts a sidewall of the embedded spacer.

6. The transistor structure of claim 5, wherein: the external spacer separates the gate electrode material from the source and the drain by a distance substantially equal to a distance by which the embedded spacer separates the gate electrode material from the source and drain.

7. The transistor structure of claim 6, wherein:

the end portion comprises less than 4 nm of the first lateral length; and the external spacer separates the gate stack from the source and the drain by no more than 4 nm.

8. The transistor structure of claim 5, wherein the external spacer comprises an amorphous dielectric material having a first composition, and the embedded spacer comprises an amorphous dielectric material having a second composition, different than the first composition.

9. The transistor structure of claim 8, wherein the embedded spacer comprises a dielectric material having a lower relative permittivity than that of the external spacer.

10. The transistor structure of claim 1, wherein:

the filament is a crystal of Ge or a III-V compound;

the source and drain each comprise an impurity-doped crystal of Ge or a III-V compound;

the gate dielectric material comprises oxygen and at least one of Hf, Al, or Ta; and the gate electrode material comprises one or more metal.

11. The transistor structure of claim 10, wherein:

the filament comprises a crystal of Ge; and the source and drain are both doped with acceptor impurities.

12. A microprocessor, comprising a plurality of nanowire transistors, each nanowire transistor having the transistor structure of claim 1.

13. The microprocessor of claim 12, wherein:

the filaments in at least a subset of the nanowire transistors comprise a crystal of predominantly Ge; and the source and drain also comprise predominantly Ge and are doped with acceptor impurities.

14. A method of fabricating a nanowire transistor, the method comprising:

forming a fin comprising a non-sacrificial semiconductor material layer, and a sacrificial material layer between the non-sacrificial semiconductor material layer and an underlying substrate, wherein forming the fin further comprises:

forming a mask over the fin protecting a first lateral length of the non-sacrificial semiconductor material; and removing unmasked portions of the fin by etching both the sacrificial and non-sacrificial material layers to expose a crystalline semiconductor region of the substrate adjacent to an isolation dielectric material;

forming lateral recesses between the non-sacrificial semiconductor material layer and the substrate by partially etching the sacrificial material layer at opposite ends of the fin, wherein partially etching the sacrificial material layer also recesses an exposed surface of the crystalline semiconductor region of the substrate to a depth below a surface of the isolation dielectric material that is substantially equal to a width of the lateral recesses;

embedding a dielectric material within the lateral recesses by depositing an amorphous material over the mask and over ends of the fin protected by the mask, the amorphous material at least partially backfilling the lateral recesses;

removing the amorphous material from the crystalline semiconductor region of the substrate while retaining the dielectric material embedded within the lateral recesses;

epitaxially growing a source crystal and a drain crystal from the crystalline semiconductor region of the substrate, the source and drain crystals contacting end portions of the non-sacrificial semiconductor material layer; and replacing a remaining portion of the sacrificial material layer between the ends of the fin with a gate stack comprising a gate electrode material separated from the non-sacrificial semiconductor material layer by a gate dielectric material, and spaced apart from the source and drain crystals by the dielectric material embedded within the lateral recesses.

15. The method of claim 14, wherein replacing a remaining portion of the sacrificial material layer with the gate stack further comprises:

removing at least a portion of the mask to expose a channel portion of the non-sacrificial material layer between the end portions;

removing the sacrificial material layer between the non-sacrificial material layer and the substrate material within the channel portion to form a filament comprising semiconductor material;

depositing the gate dielectric material on all exposed surfaces of the filament and on a surface of the dielectric material; and depositing the gate electrode material on the gate dielectric material in a space between the filament and the substrate.

16. The method of claim 14, wherein:

depositing the amorphous material over the mask further comprises conformally depositing a dielectric material having a relative permittivity below 3.5; and removing the dielectric material from sidewalls of the mask while retaining the dielectric material embedded within the lateral recesses further comprises anisotropically etching through a vertical thickness of the dielectric material adjacent to a sidewall of the mask.

17. The method of claim 14, wherein: forming the fin further comprises:
   epitaxially growing a multi-layered stack comprising a plurality of non-sacrificial semiconductor material layers separated by intervening sacrificial material layers.

* * * * *